United States Patent [19]

Shier

[11] Patent Number: 4,959,618
[45] Date of Patent: Sep. 25, 1990

[54] DIFFERENTIAL CHARGE PUMP FOR A PHASE LOCKED LOOP

[75] Inventor: John S. Shier, Apple Valley, Minn.

[73] Assignee: VTC Incorporated, Bloomington, Minn.

[21] Appl. No.: 311,216

[22] Filed: Feb. 16, 1989

[51] Int. Cl.$^5$ .................. H03D 13/00; H03K 9/06; H03K 5/13

[52] U.S. Cl. .................. 328/155; 328/133; 307/511; 307/516; 307/264; 331/1 A; 331/25

[58] Field of Search ............... 328/111, 127, 133, 155; 307/510, 511, 514, 516, 494, 234, 262, 355, 264; 331/1 A, 8, 17, 25, 111

[56] References Cited

U.S. PATENT DOCUMENTS

| | | | |
|---|---|---|---|
| 4,207,539 | 6/1980 | Minakuchi | 331/8 |
| 4,485,353 | 11/1984 | Fang et al. | 331/8 |
| 4,485,354 | 11/1984 | Shanley, II et al. | 331/8 |
| 4,527,277 | 7/1985 | Kosaka et al. | 307/516 |
| 4,546,330 | 10/1985 | Okada | 331/17 |
| 4,636,748 | 1/1987 | Latham, II | 331/17 |
| 4,686,481 | 8/1987 | Adams | 307/516 |
| 4,743,857 | 5/1988 | Childers | 331/25 |
| 4,772,793 | 9/1988 | Lakson et al. | 307/234 |

Primary Examiner—Timothy P. Callahan
Attorney, Agent, or Firm—Kinney & Lange

[57] ABSTRACT

A differential charge pump for use in a phase locked loop. The charge pump generates a voltage difference signal proportional to the duration of first and second pulse trains provided by a phase comparator. The charge pump includes a differential amplifier for generating the difference signal, first and second RC filter networks connected between the noninverting and inverting terminals of the differential amplifier and a reference node, respectively. Parallel, all-NPN switching networks apply charging current pulses to the first RC filter network in response to the first pulse train and they apply charging current pulses to the second RC filter network in response to the second pulse train.

10 Claims, 2 Drawing Sheets

DIFFERENTIAL CHARGE PUMP FOR A PHASE LOCKED LOOP

BACKGROUND OF THE INVENTION

1. Field of the Invention.

The present invention relates to charge pumps used as loop filters in phase locked loops.

2. Description of the Prior Art.

Phase locked loops are used widely in data communications, disk and tape drives, frequency synthesizers, and many other areas of modern electronics. Phase locked loops synchronize a variable local oscillator with the phase of a transmitted signal, thus allowing, for example, recovery of the clock of the transmitted signal.

A phase locked loop is typically constructed from a phase detector and a voltage controlled oscillator. The phase detector detects the phase difference between a clock signal and the incoming transmitted data signal. Provision is made for adjusting a control signal in proportion to the phase difference. The voltage control oscillator generates the clock signal, the frequency of which varies as a function of the control signal. A second order phase locked loop further includes a filter between the phase detector and the voltage controlled oscillator. The filter can be used to prevent the phase locked loop from capturing and locking onto harmonics of the transmitted signal and for increasing the stability of the recovered clock. The filter can also be used to define operational bandwidth for the device.

Charge pump type filters for phase locked loops are popular for filtering in "baseband" data communication, i.e. direct data pulse transmission. They are used for recovery of the clock of the transmitted data. With charge pumps in a phase locked loop, the phase detector is typically adapted to generate "UP" pulses on a first output terminal when the phase of the incoming data leads the phase of the clock, and "DOWN" pulses on a second output terminal when the phase of the clock leads the phase of the incoming clock. A cumulative duration of "UP" pulses exceeding the cumulative pulse duration of the "DOWN" pulses indicates that the frequency of the output signal of the voltage controlled oscillator is to be increased. "DOWN" pulse cumulative duration in excess of the "UP" pulses indicates that the frequency of the output signal of the voltage controlled oscillator is to be decreased.

In prior art devices, the UP and DOWN pulses are used to generate relatively positive and negative pulses of current. The difference of the integrals of the positive and negative pulses of current is proportional to the detected phase difference. A capacitor is provided to integrate the opposite polarity current pulses and thereby indirectly provide a control signal for the voltage controlled oscillator.

An ideal charge pump exhibits:

(1) equal amplitude UP and DOWN current;

(2) symmetric transient characteristics between the UP and DOWN currents; and (3) a steady state output, i.e. equal duration UP and DOWN currents, when the phase detector indicates matched phase between the voltage controlled oscillator and the transmitted signal.

Such characteristics have not been readily obtained in prior art circuits, particularly when such circuits have been carried over into solid state implementation. U.S. Pat. No. 4,636,748 issued Jan. 13, 1988 to Latham, II, noted that prior art charge pumps, which used complementary current sources to provide the opposite polarity UP and DOWN currents, required matched operating characteristics in the NPN and PNP transistors. Realization of matching characteristics between NPN and PNP devices embodied in the monolithic integrated circuit is extremely difficult. Devices so constructed have given unsatisfactory performance. In the present state of the art, integrated PNP transistors are inferior to NPN devices, particularly in terms of frequency response.

Latham II, proposed an all NPN charge pump. The Latham pump uses a single current source and two identical current switching paths arranged in a bridge circuit. Each arm of the bridge circuit includes an NPN transistor switch. A capacitor is connected between a pair of opposed nodes in the bridge. A voltage source and a current source, respectively, are connected to the remaining two nodes. The UP and DOWN pulses are applied to transistor switches in opposed arms of the bridge, respectively. An UP pulse is applied to one of the transistor switches connecting the voltage source to one terminal of the capacitor and to the transistor switch connecting the opposite terminal of the capacitor to the current source. A DOWN pulse is applied to the second transistor connecting the voltage source to a terminal of the capacitor and to the transistor connecting the opposite terminal of the capacitor to the current source. In other words, UP and DOWN pulses result in switching in the bridge circuit to form symmetric current paths across the bridge and, in opposite directions, through the capacitor. An UP pulse charges the capacitor, a DOWN pulse discharges the capacitor. Simultaneous UP and DOWN pulses, or the absence of either, leave the charge on the capacitor unaffected. The phase locked loop filter is connected across the opposite terminals of the capacitor, being adapted to provide a control signal to the voltage controlled oscillator from the differential signal.

SUMMARY OF THE INVENTION

The present invention provides parallel, symmetric filter circuits for the separate UP and DOWN pulse trains from a phase comparator element of a fully integrated phase locked loop. The filtered outputs are applied to the inverting and noninverting input terminals of a differential amplifier which generates a control signal for application to the voltage controlled oscillator.

UP and DOWN pulse trains are generated by a phase comparator in response to comparison of the relative phases of an incoming data stream and the output signal of a local variable oscillator element, e.g., a voltage controlled oscillator. The frequency of the output signal of the voltage controlled oscillator is a function of the voltage amplitude of a control signal applied thereto. The object of the phase locked loop is to match the frequency of the output signal of the voltage controlled oscillator to the frequency of the incoming data stream. To do this, a control signal of the appropriate amplitude is generated in response to the UP and DOWN pulse trains.

Generation of the control signal from the UP and DOWN pulse trains is the function of the charge pump. The charge pump of the present invention utilizes an all NPN switching network to develop UP and DOWN current pulses for charging an UP pulse integration capacitor and a DOWN pulse integration capacitor, respectively. The frequency responses of the switching networks are matched by using matched NPN transistors, providing equal duration current pulses at matched data stream and local oscillator frequency. The amplitudes of the current pulses are matched by using mirrored current sources. One terminal of each integration capacitor is connected to a common node tied to a regulated voltage level. Both capacitors have matched DC discharge paths (with very long RC time constants). The terminal of the capacitors not connected to the common node is connected to be charged exclusively by either the UP current pulses or the DOWN current pulses. These same capacitor terminals are connected to either the inverting or the noninverting terminal of the differential amplifier.

The differential amplifier generates the control signal, which is proportional to the difference between the voltage levels of its input terminals. The amplitude of the control signal may be offset by a predetermined voltage to provide a lower limit to the control signal, and, thereby, a lower limit frequency for the output signal of the voltage controlled oscillator.

DETAILED DESCRIPTION OF THE PREFERRED EMBODIMENTS

Figure 1:
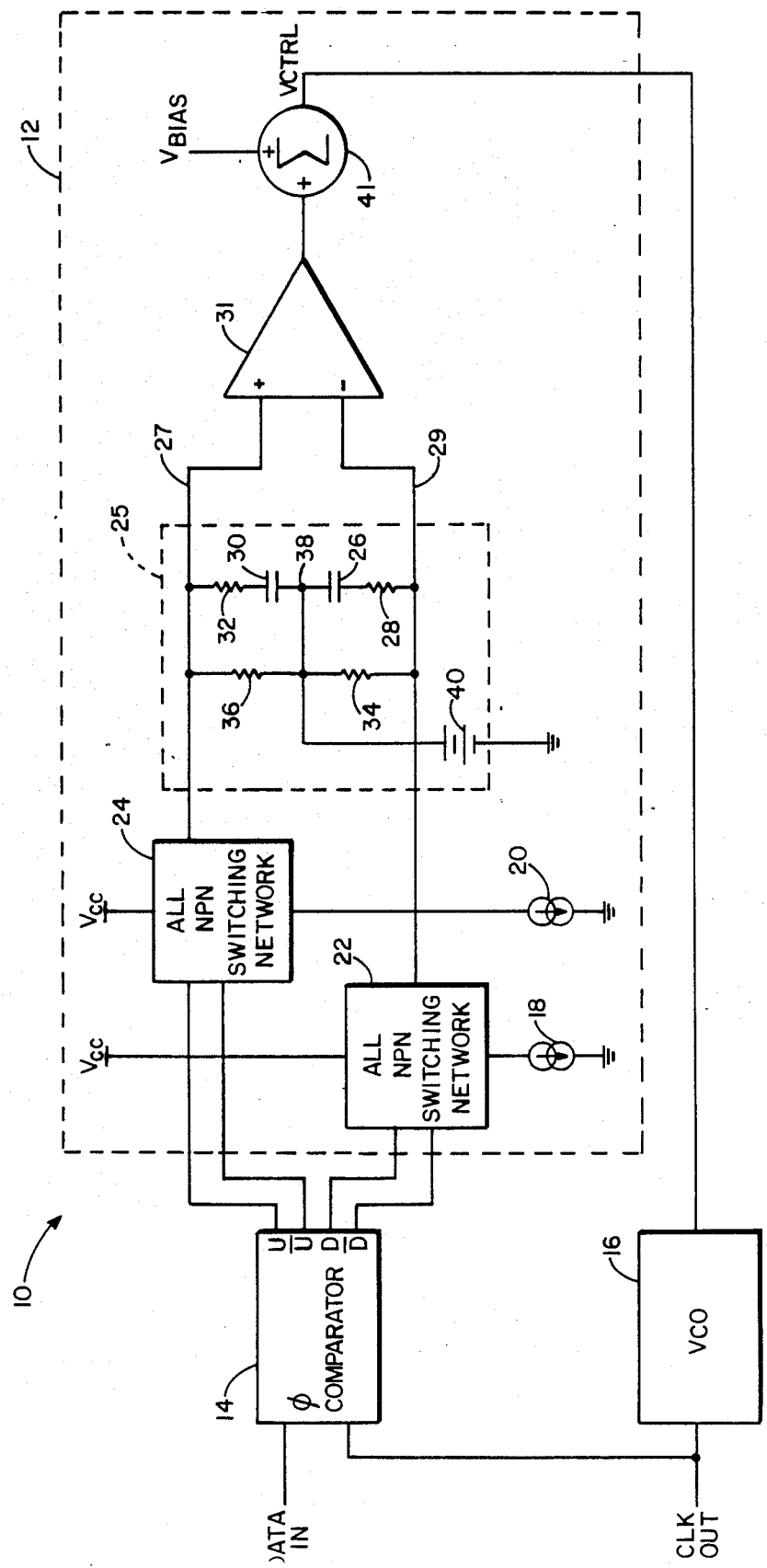
FIG. 1 is a block diagram circuit schematic of a phase locked loop incorporating the charge pump of the present invention.

FIG. 1 illustrates a phase locked loop 10 suitable for incorporation with a 100 MHz phase detector in a monolithic integrated fiber optic receiver. Phase locked loop 10 is conventional except for a differential charge pump 12 connected in the loop between phase comparator 14 and voltage controlled oscillator ("VCO") 16.

Phase comparator 14 detects phase differences between an incoming baseband data signal and a recovered reference clock signal from VCO 16. Phase comparator 14 generates UP ("U" in the figures) signals to indicate the reference clock lags the incoming data signal and DOWN ("D" in the figures) signals to indicate that the reference clock leads the incoming data signal. Matched phase between the clock and the incoming data produces short duration, simultaneous UP and DOWN pulses. The frequency of the reference clock produced by VCO 16 is changed by controlling the voltage of a control signal applied to the VCO. Typically, increasing the voltage of the control signal results in a clock output from VCO 16 and decreasing the voltage level of the control signal results in a clock output of decreasing frequency.

The control signal is generated by charge pump 12, which integrates over time the UP and DOWN signals generated by phase comparator 14. The UP and DOWN signals, and the complementary counterparts thereto, complementary UP ("Ū" in the figures) and complementary DOWN ("D̄" in the figures), are transmitted from phase comparator 14 to charge pump 12. Charge pump 12 increases the voltage level of the control signal when the cumulative duration of the UP signals exceeds the cumulative duration of the DOWN signals. Where the cumulative duration of the DOWN signals exceeds the cumulative duration of the UP signals, the voltage level of the control signal is reduced.

Charge pump 12 includes a pair of matched current sources 18 and 20. Matched switching networks 22 and 24 determine from where current sources 18 and 20, respectively, draw current. Where the UP signal is high, current source 20 draws current from Vcc. Similarly, where the DOWN signal is high, current source 18 draws its current requirements from Vcc. Where the UP signal is low, current source 20 draws current through switching network 24 from filter 25. Where the DOWN signal is low, current source 18 draws current from filter 25 through switching network 22.

Filter network 25 is connected to switching networks 22 and 24 along circuit nodes 29 and 27, respectively. Nodes 27 and 29 are also connected to the noninverting (+) and inverting (−) terminals, respectively, of differential amplifier 31. The voltage levels appearing on nodes 27 and 29 are functions of the quantity of charge imposed on capacitors 26 and 30. Capacitor 26 is connected in series with resistor 28 between node 38 and node 29. Charging of capacitor 26 is effected by current source 18 drawing its current requirements from node 38, through capacitor 26 and resistor 28 to node 29, and from node 29 through switching network 22 to the current source. Capacitor 30 is connected in series with resistor 32 between node 38 and node 27. The charging of capacitor 30 occurs when current source 20 draws current from node 38 through capacitor 30 and resistor 32 to node 27 and from node 27 through switching network 24 to the current source. In other words, capacitors 26 and 30, respectively, are charged whenever the DOWN and UP signals are high, respectively. Node 38 is held at a constant voltage level by potential source 40.

Absent discharge of capacitors 26 and 30, the charge on the capacitors would, theoretically, reflect integration of the UP and DOWN signal pulses from the beginning of operation of phase locked loop 10. Of course, such a result cannot in fact occur. Charge on the capacitors would eventually rise to levels where current sources 18 and 20 would be unable to draw current through capacitors 26 and 30, or the capacitors would be charged to the point of internal dielectric breakdown. Moreover, resistors 34 and 36 are connected across nodes 38 and 27 and 38 and 29, respectively, for providing discharge paths for the capacitors. The resistances of the resistors 34 and 36 are matched and greatly exceed the resistance of resistors 28 and 32. Thus, the charge on capacitors 26 and 30 reflects recent history of the relative durations of the DOWN and UP pulses, with the greatest weight given the most recent events.

Differential amplifier 31 generates a precursor control signal which varies directly as the difference between the voltage levels on nodes 27 and 29. The voltage levels on the respective nodes varies directly as a function of the charge on capacitors 26 and 30. Thus, the precursor control signal reflects recent relative duration of the UP and DOWN signals.

The precursor control signal is summed with a voltage offset signal by signal summing circuit 41 to produce control signal Vctrl. The offset voltage is provided to insure a minimum frequency output from VCO 16 and can be programmed to determine that minimum clock reference. Thus, a gain for differential amplifier 31 can be selected which insures that phase locked loop 12 does not lock on a harmonic frequency of the incoming data signal.

Figure 2:
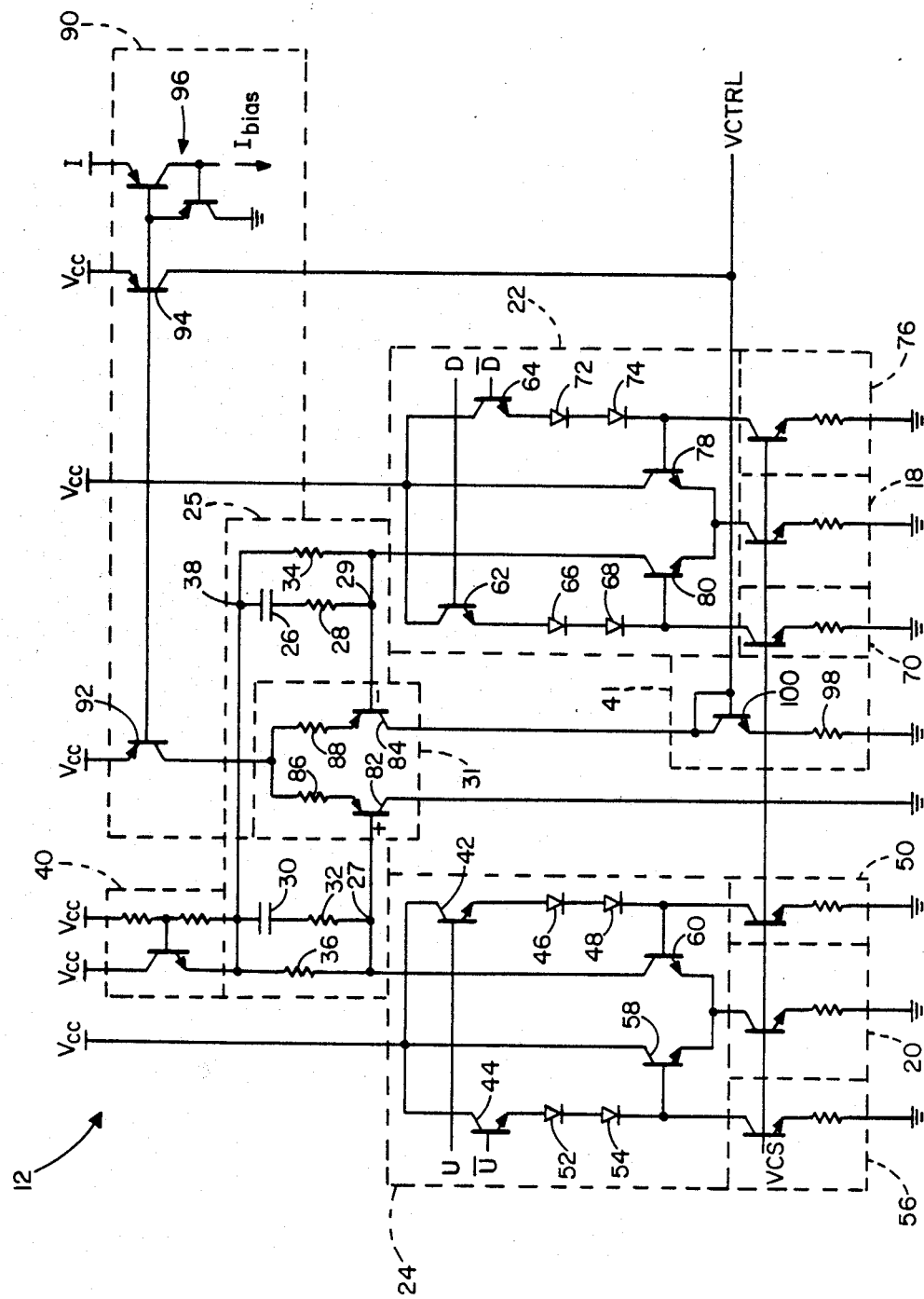
FIG. 2 is a circuit schematic of the preferred embodiment of the charge pump of the present invention.

FIG. 2 illustrates a detailed circuit schematic for charge pump 12, in which like numbers refer to structurally analogous parts in FIG. 1. Switching networks 20 and 22 are constructed exclusively of NPN bipolar transistors to give maximum switching speed and to insure nearly matching response characteristics between the switching networks.

In switching network 24, NPN bipolar transistors 42 and 44 are connected at their collectors to a common voltage source Vcc. The UP signal and the complementary UP signal are applied to the bases of transistors 42 and 44, respectively. Transistor 42 is connected at its emitter by two series connected level shifting diodes 46 and 48 to current source 50, the diodes being oriented to conduct current from the emitter of transistor 42 to current source 50. Transistor 44 is similarly connected at its emitter by two series-connected level shifting diodes 52 and 54 to current source 56, again with the diodes oriented to carry current from the emitter of the transistor 44 to current source 56.

A pair of switching transistors 58 and 60 are connected at their respective emitters to supply current drawn by current source 20. The base of NPN bipolar switching transistor 58 is connected to the node between diode 54 and current source 56. Because transistor 44 is always conducting, under the influence of current source 56, the voltage level appearing at the base of transistor 58 follows the voltage level applied to the base of transistor 44 less three diode junction voltage level drops, i.e. the voltage level of the complementary UP signal less a little over 2 volts. Similarly, the base of transistor 60 is connected to the node between diode 48 and current source 50. Because transistor 42 is always conducting under the influence of current source 50, the voltage level appearing at the base of transistor 60 follows the voltage level applied to the base of transistor 42 less three diode junction voltage level drops, i.e. the voltage level of the UP signal less a little over 2 volts.

Transistors 58 and 60 with current source 20 operate as a differential switch. Accordingly, the relative polarities of the UP and the complementary UP signals determine which of transistors 58 and 60 are conducting. Where the UP signal is relatively positive, switch 60 conducts and current is drawn through capacitor 30, charging the capacitor. The voltage level on node 27 will steadily rise. Where the complementary UP signal is relatively positive, transistor 48 is conducting and the current drawn by current source 20 is satisfied from Vcc.

In switching network 22 NPN bipolar transistors 62 and 64 are connected at their collectors to a common voltage source Vcc. The DOWN signal and the complementary DOWN signal are applied to the base terminals of transistors 62 and 64, respectively. Transistor 62 is connected at its emitter by two series-connected level shifting diodes 66 and 68 to current source 70, the diodes being oriented to conduct current from the emitter to the current source. Transistor 64 is similarly connected at its emitter by two series-connected level shifting diodes 72 and 74 to current source 76, again with the diodes oriented to carry current from the emitter to the current source.

A pair of switching transistors 78 and 80 are connected at their respective emitters to supply current drawn by current source 18. The base of NPN bipolar switching transistor 78 is connected to the node between diode 74 and current source 76. Because transistor 64 is always conducting under the influence of current source 76, the voltage level appearing at the base of transistor 78 follows the voltage level applied to the base of transistor 64 less three diode junction voltage level drops, i.e. the voltage level of the complementary DOWN signal less a little over 2 volts. Similarly, the base of transistor 80 is connected to the node between diode 68 and current source 70. Because transistor 62 is always conducting under the influence of current source 70, the voltage level appearing at the base of transistor 80 follows the voltage level applied to the base of transistor 62 less three diode junction voltage level drops, i.e. the voltage level of the DOWN signal less a little over 2 volts. Transistors 78 and 80 with current source 22 operate as a differential switch. Accordingly, the relative polarities of the DOWN and the complementary DOWN signals determine which of transistors 78 and 80 are conducting. Where the DOWN signal is relatively positive, switch 80 conducts and current is drawn through capacitor 26, charging the capacitor. The voltage level on node 29 will steadily rise. Where the complementary DOWN signal is relatively positive, transistor 78 is conducting and the current drawn by current source 18 is satisfied from Vcc.

Capacitors 26 and 30 are connected from node 38 to nodes 29 and 27, respectively, supporting voltage levels on the respective nodes with respect to node 38 reflecting recent history of the absolute durations of the DOWN and UP signals. The voltage level on node 38 is held constant by a level shifting multiplier 40, which is connected between the node and voltage source Vcc. The voltage level of node 38 is selected to avoid overdriving current source 92 in current mirror circuit 90. Capacitors 26 and 30 are discharged by resistors 34 and 36, which are selected to have much larger resistances than resistors 28 and 32.

The voltage level difference between nodes 26 and 30 provides indication of the relative difference in duration between UP and DOWN signals. Nodes 27 and 29 are connected to the noninverting and the inverting terminals, respectively, of a differential amplifier 31. Differential amplifier 31 thus generates a precursor control signal the voltage level of which varies as a function of the difference in the relative voltage levels on nodes 27 and 29. Put another way, the frequency components of the UP and DOWN signals have been filtered from the signals and the differential amplifier 31 need only respond to the time integrals of the UP and DOWN signals. Differential amplifier 31 can, because of the absence of quick switching demands, be constructed of low frequency, lateral PNP transistors, herein transistors 82 and 84. The base of transistor 82 corresponds to the noninverting terminal of amplifier 31 and the base of transistor 84 corresponds to the inverting terminal of the amplifier. The collectors of transistor 82 are connected to chassis ground and the emitters of both transistors are connected by resistors 86 and 88, respectively, to current source 92 in current mirror circuit 90. The collector of transistor 84 corresponds to the output terminal of differential amplifier 31 and is connected by summing circuit 42 to chassis ground.

Summing circuit 41 operates by providing the load element for differential amplifier 31 and the emitter impedance for current source 94 in current mirror circuit 90. The current through current source 94 generates a minimum cutoff level for Vctrl equal to the voltage drop across resistor 98 plus one Vbe drop across transistor 100. The proportion of current drawn by current source 92 through transistor 84 and resistor 98 generates the variation in the voltage level of the control signal output.

Current mirror circuit 90 allows the minimum control signal voltage level to be programmed, and further scales the minimum control level voltage and the range of control signal variation to insure that phase locked loop 10 does not lock onto harmonics of the frequency of the incoming data signal (unless, of course, such a result is desired). Programming is done by selecting an appropriate bias current to pass through beta helper transistor pair 96. Current sources 94 and 92 mirror the bias current in the ratios of 14:1 and 2:1, respectively. Accordingly the variation in Vctrl with respect to ground is a small fraction of the minimum level of Vctrl with respect to ground defining the bandwidth of operation.

The charge pump of the present invention provides an inherently more symmetrical and balanced charge pump because the UP and DOWN filtering and pumping arrangements are symmetric. For 100 MHz operation, such as contemplated for phase locked loops constructed in accordance with the present invention, close to ideal operation of the charge pump takes on particular importance.

Although the present invention has been described with reference to preferred embodiments, workers skilled in the art will recognize that changes may be made in form and detail without departing from the spirit and scope of the invention.

What is claimed is:

1. A charge pump for filtering and integrating first and second pulse trains for producing a voltage difference signal proportional to the difference in relative duration of the pulses of the first and second pulse trains, the charge pump comprising:
   a common node;
   first capacitor means connected to the common node;
   first current source means for generating a first source current;
   a first switching circuit connected at a first terminal to the first capacitor means and at a second terminal to the first current source means and responsive to the first pulse train for passing the first source current through the first capacitor means from the common node;
   second capacitor means connected to the common node;
   second current source means for generating a second source current;
   a second switching circuit connected at a first terminal to the second capacitor means and at a second terminal to the second current source means and responsive to the second pulse train for passing the second source current through the second capacitor means for the common node;
   a differential amplifier connected at one input terminal to the first terminal of the first switching circuit and the remaining input terminal to the first terminal of the second switching circuit for generating the voltage difference signal; and
   first discharge resistor means connected across the first capacitor means and second discharge resistor means connected across the second capacitor means.

2. The charge pump of claim 1 wherein the first and second capacitor means each include a capacitor and a resistor connected in series.

3. The charge pump of claim 1 wherein inverse signal trains for the first and second pulse trains are available and further wherein each of the first and second switching circuits includes:
   first and second NPN bipolar switching transistors connected at their emitters to the respective current source means for the switching circuit;
   the collector of the first NPN bipolar switching transistor being connected to the input terminal of the differential amplifier;
   the collector of the second NPN bipolar switching transistor being connected to a voltage source;
   the base of the first NPN bipolar switching transistor being connected to be responsive to a pulse train for switching into the conductive state for satisfying the current drawn by the current source means; and
   the base of the second NPN bipolar switching transistor being connected to be responsive to the inverse of the pulse train for satisfying the current drawn by the current source means.

4. A phase locked loop comprising:
   a voltage controlled oscillator responsive to a voltage difference signal for producing an output signal which is periodic at a frequency proportional to the voltage difference signal;
   phase comparator means for detecting a phase difference between said output signal and a reference signal, and for producing first and second pulse trains, the difference between the duration of which is proportional to a measure of phase difference, and for producing first and second inverse signals for the first and second pulse trains; and
   a charge pump for filtering and integrating first and second pulse trains for producing a voltage difference signal proportional to the difference in relative duration of the pulses of the first and second pulse trains, the charge pump comprising:
   a common node,
   first capacitor means connected to the common node,
   first current source means for generating a first source current,
   a first switching circuit connected at a first terminal to the first capacitor means and at a second terminal to the first current source and responsive to the first pulse train for passing the first source current through the first capacitor means from the common node,
   second capacitor means connected to the common node,
   second current source means for generating a second source current, a second switching circuit connected at a first terminal to the second capacitor means and at a second terminal to the second current source and responsive to the second pulse train for passing the second source current through the second capacitor means from the common node,
   a differential amplifier connected at one input terminal to the first terminal of the first switching circuit and the remaining input terminal to the first terminal of the second switching circuit for generating the voltage difference signal; and
   first discharge resistor means connected across the first capacitor means and second discharge resistor means connected across the second capacitor means.

5. The phase locked loop of claim 4 wherein the first and second capacitor means each include a capacitor and a resistor connected in series.

6. A charge pump for filtering and integrating first and second pulse trains for producing a voltage difference signal proportional to the difference in relative duration of the pulses of the first and second pulse trains, the charge pump comprising:
   a common node;
   first capacitor means connected to the common node;
   first current source means for generating a first source current;
   a first switching circuit connected at a first terminal to the first capacitor means and at a second terminal to the first current source means and responsive to the first pulse train for passing the first source current through the first capacitor means from the common node;
   second capacitor means connected to the common node;
   second current source means for generating a second source current;
   a second switching circuit connected at a first terminal to the second capacitor means and at a second terminal to the second current source means and responsive to the second pulse train for passing the second source current through the second capacitor means from the common node;
   each of the first and second switching circuits including;
   first and second NPN bipolar switching transistors connected at their emitters to the respective current source means for the switching circuit;
   the collector of the first NPN bipolar switching transistor being connected to the input terminal of the differential amplifier;
   the collector of the second NPN bipolar switching transistor being connected to a voltage source;
   the base of the first NPN bipolar switching transistor being connected to be responsive to a pulse train for switching into the conductive state for satisfying the current drawn by the current source; and
   the base of the second NPN bipolar switching transistor being connected to be responsive to the inverse of the pulse train for satisfying the current drawn by the current source; and
   a differential amplifier connected at one input terminal to the first terminal of the first switching circuit and the remaining input terminal to the first terminal of the second switching circuit for generating the voltage difference signal.

7. The charge pump of claim 6 wherein each of the first and second switching circuits further include first and second level shifting networks connected to the bases of the first and second NPN bipolar switching transistors, respectively, for controlling the switching of the transistors.

8. A phase locked loop comprising:
   a voltage controlled oscillator responsive to a voltage difference signal for producing an output signal which is periodic at a frequency proportional to the voltage difference signal;
   phase comparator means for detecting a phase difference between said output signal and a reference signal, and for producing first and second pulse trains, the difference between the duration of which is proportional to a measure of phase difference, and for producing first and second inverse signals for the first and second pulse trains;
   a charge pump for filtering and integrating first and second pulse trains for producing a voltage difference signal proportional to the difference in relative duration of the pulses of the first and second pulse trains, the charge pump comprising:
   a common node,
   first capacitor means connected to the common node,
   first current source means for generating a first source current,
   a first switching circuit connected at a first terminal to the first capacitor means and at a second terminal to the first current source and responsive to the first pulse train for passing the first source current through the first capacitor means from the common node,
   second capacitor means connected to the common node,
   second current source means for generating a second source current, a second switching circuit connected at a first terminal to the second capacitor means and at a second terminal to the second current source and responsive to the second pulse train for passing the second source current through the second capacitor means from the common node, and
   a differential amplifier connected at one input terminal to the first terminal of the first switching circuit and the remaining input terminal to the first terminal of the second switching circuit for generating the voltage difference signal; and
   means for offsetting the voltage difference signal by a predetermined voltage amplitude.

9. The phase locked loop of claim 8 wherein each of the first and second switching circuits further include first and second level shifting networks connected to the base of the first and second NPN bipolar switching transistors, respectively, for controlling the switching of the transistors.

10. The charge pump of claim 9 wherein each level shifting network comprises:
   an NPN bipolar transistor connected at its base to receive a pulse train or the inverse of a pulse train;
   the collector of the NPN bipolar transistor being connected to a source of potential;
   voltage level shifting means connecting the emitter of the NPN bipolar transistor to the base of the NPN bipolar switching transistor; and
   a current source connected to the base of the switching transistor and drawing its current from the emitter of the NPN bipolar transistor through the voltage level shifting means.

* * * * *

UNITED STATES PATENT AND TRADEMARK OFFICE
CERTIFICATE OF CORRECTION

PATENT NO. : 4,959,618

DATED : September 25, 1990

INVENTOR(S) : John S. Shier

It is certified that error appears in the above-identified patent and that said Letters Patent is hereby corrected as shown below:

Col. 10, line 46, delete "base", insert --bases--.

Signed and Sealed this

Seventh Day of January, 1992

Attest:

HARRY F. MANBECK, JR.

*Attesting Officer*     *Commissioner of Patents and Trademarks*